United States Patent
Wann et al.

(10) Patent No.: US 10,978,451 B2
(45) Date of Patent: *Apr. 13, 2021

(54) COMPLIMENTARY METAL-OXIDE-SEMICONDUCTOR (CMOS) WITH LOW CONTACT RESISTIVITY AND METHOD OF FORMING SAME

(71) Applicant: Taiwan Semiconductor Manufacturing Company, Ltd., Hsinchu (TW)

(72) Inventors: Clement Hsingjen Wann, Carmel, NY (US); Chih-Hsin Ko, Fongshan (TW); Cheng-Hsien Wu, Hsinchu (TW); Ding-Kang Shih, New Taipei (TW); Hau-Yu Lin, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/710,350

(22) Filed: Dec. 11, 2019

(65) Prior Publication Data

US 2020/0119013 A1 Apr. 16, 2020

Related U.S. Application Data

(60) Continuation of application No. 16/203,768, filed on Nov. 29, 2018, now Pat. No. 10,510,754, which is a
(Continued)

(51) Int. Cl.
*H01L 27/092* (2006.01)
*H01L 21/8238* (2006.01)

(52) U.S. Cl.
CPC .... *H01L 27/092* (2013.01); *H01L 21/823814* (2013.01); *H01L 21/823871* (2013.01); *H01L 2924/0002* (2013.01)

(58) Field of Classification Search
CPC .......... H01L 27/092; H01L 21/823814; H01L 21/823871; H01L 2924/0002
See application file for complete search history.

(56) References Cited

U.S. PATENT DOCUMENTS 6,222,240 B1 * 4/2001 Gardner ............ H01L 21/28229
257/384
6,506,676 B2 1/2003 Park et al.
(Continued)

FOREIGN PATENT DOCUMENTS

| KR | 20010076840 A | 8/2001 |
| KR | 20020056140 A | 7/2002 |
| KR | 20130095633 A | 8/2013 |

OTHER PUBLICATIONS

Green, et al., "Perry's Chemical Engineers' Handbook," eBook, 8th ed., McGraw-Hill 2008, pp. 2-193.
(Continued)

*Primary Examiner* — Sitaramarao S Yechuri
(74) *Attorney, Agent, or Firm* — Slater Matsil, LLP

(57) ABSTRACT

An embodiment complimentary metal-oxide-semiconductor (CMOS) device and an embodiment method of forming the same are provided. The embodiment CMOS device includes an n-type metal-oxide-semiconductor (NMOS) having a titanium-containing layer interposed between a first metal contact and an NMOS source and a second metal contact and an NMOS drain and a p-type metal-oxide-semiconductor (PMOS) having a PMOS source and a PMOS drain, the PMOS source having a first titanium-containing region facing a third metal contact, the PMOS drain including a second titanium-containing region facing a fourth metal contact.

20 Claims, 7 Drawing Sheets

Related U.S. Application Data division of application No. 13/729,806, filed on Dec. 28, 2012, now Pat. No. 10,304,826.

(56) References Cited

U.S. PATENT DOCUMENTS

| | | | |
|---|---|---|---|
| 6,528,381 | B2 | 3/2003 | Lee et al. |
| 8,110,877 | B2 | 2/2012 | Mukherjee et al. |
| 2003/0235936 | A1* | 12/2003 | Snyder .................. H01L 27/095 438/92 |
| 2005/0045965 | A1* | 3/2005 | Lin .................... H01L 29/66795 257/384 |
| 2008/0145984 | A1* | 6/2008 | Ke ..................... H01L 21/28518 438/197 |
| 2008/0237743 | A1 | 10/2008 | Ramin et al. |
| 2010/0123198 | A1* | 5/2010 | Kim .................. H01L 21/76804 257/377 |
| 2010/0155846 | A1* | 6/2010 | Mukherjee ............ H01L 21/285 257/365 |
| 2010/0224916 | A1 | 9/2010 | Shimizu et al. |
| 2010/0255652 | A1* | 10/2010 | Tanioku ............ H01L 21/02186 438/381 |
| 2011/0151136 | A1* | 6/2011 | Rui ................... H01L 21/31604 427/539 |
| 2012/0139062 | A1* | 6/2012 | Yuan ............... H01L 21/823462 257/411 |
| 2012/0196411 | A1* | 8/2012 | Tsuchiya ............. H01L 27/0922 438/151 |
| 2013/0106330 | A1 | 5/2013 | Schramm et al. |

OTHER PUBLICATIONS

Lai, J.B. et al., "Effects of composition on the formation temperatures and electrical resistivities of C54 titanium germanosilicide in Ti—Si 1-x Ge x systems," AIP Journal of Applied Physics, vol. 86, No. 3, 1340, Aug. 1, 1999, 7 pages.

Lin, J.-Y.J., et al., "Increase in current density for metal contacts to n-germanium by inserting Ti2 interfacial layer to reduce Schottky barrier height," Appl. Phys. Lett. 98, 092113 (2011); 4 pages.

Vaquila et al., "Oxidation Process in Titanium Thin Films", Physical Review B, vol. 55, No. 20, May 15, 1997-11, pp. 13925-13931, The American Physical Society.

Yuan, Z., et al., "Schottky barrier height reduction for metal/n-GaSb contact by inserting $TiO_2$ interfacial layer with low tunneling resistance," Appl. Phys. Letter. 98, 172106 (2011), 4 pages.

* cited by examiner

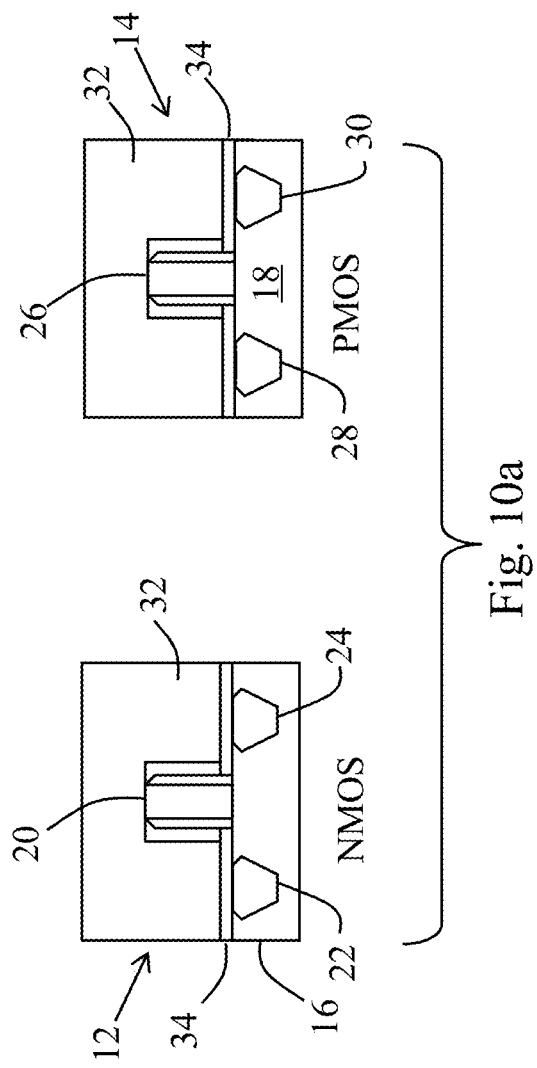
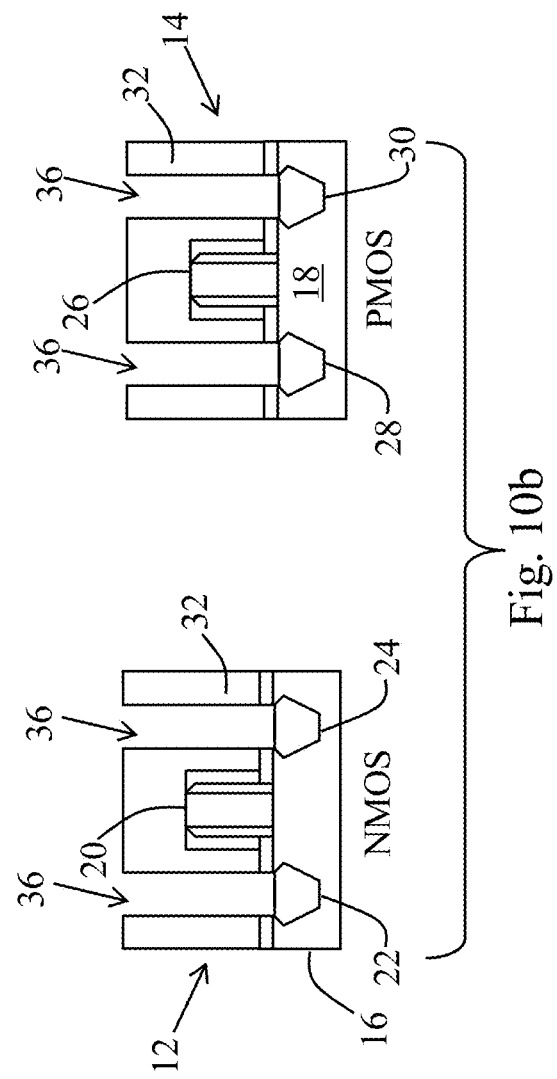
Fig. 10a
Fig. 10b

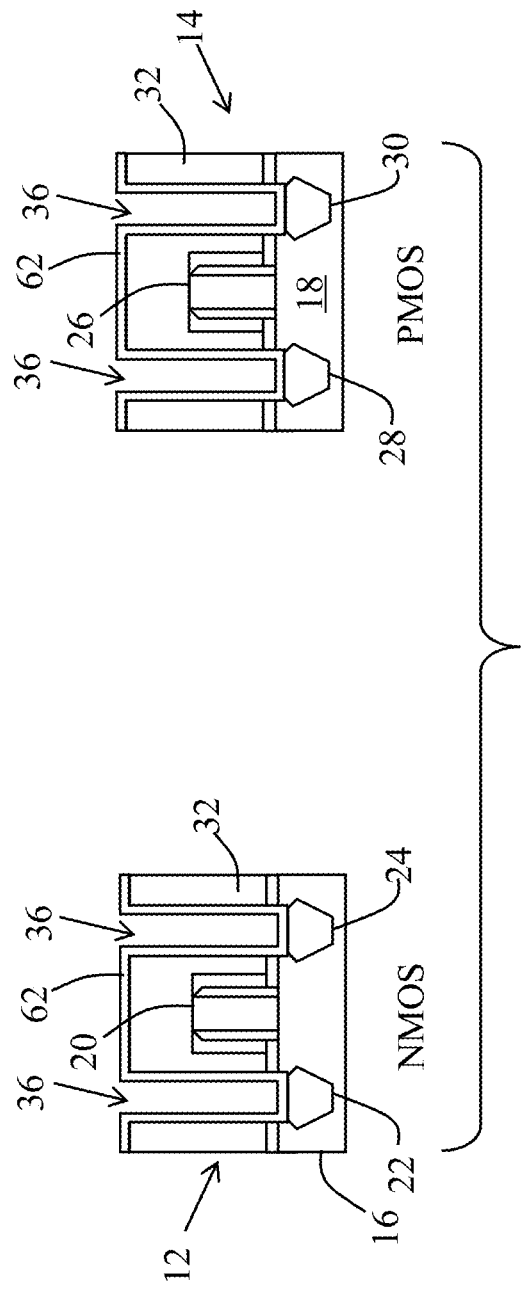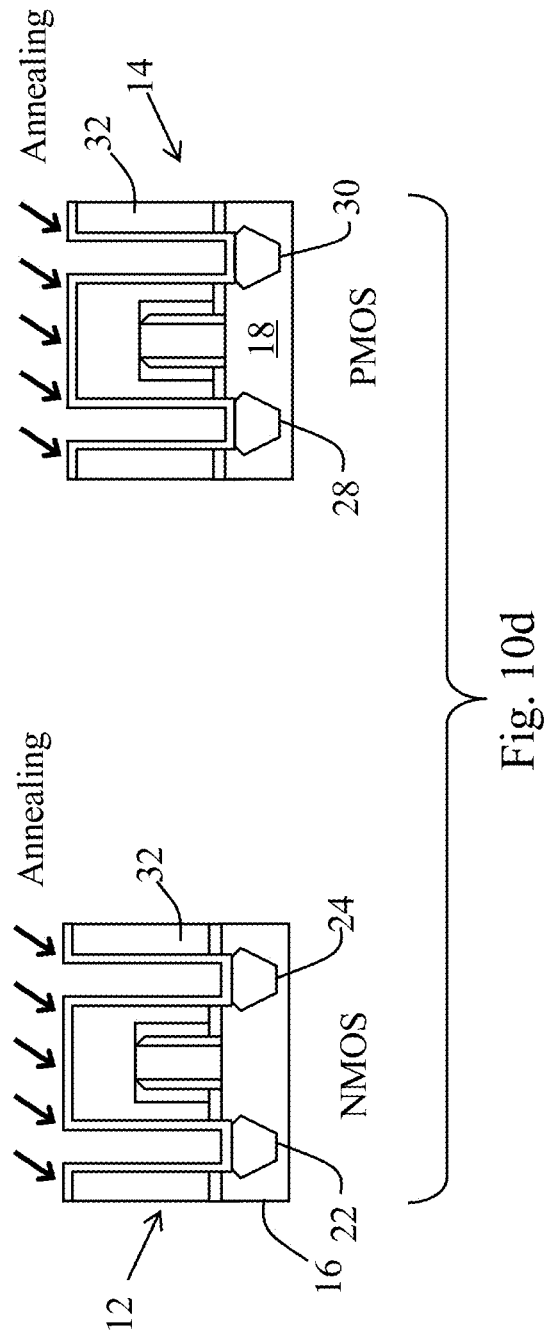
Fig. 10c
Fig. 10d

US 10,978,451 B2

COMPLIMENTARY METAL-OXIDE-SEMICONDUCTOR (CMOS) WITH LOW CONTACT RESISTIVITY AND METHOD OF FORMING SAME

PRIORITY CLAIM AND CROSS-REFERENCE

This application is a continuation of U.S. patent application Ser. No. 16/203,768, entitled "Complimentary Metal-Oxide-Semiconductor (CMOS) with Low Contact Resistivity and Method of Forming Same," and filed Nov. 29, 2018, which is a is a divisional of U.S. patent application Ser. No. 13/729,806, entitled "Complimentary Metal-Oxide-Semiconductor (CMOS) with Low Contact Resistivity and Method of Forming Same," and filed Dec. 28, 2012, now U.S. Pat. No. 10,304,826 issued May 28, 2019, which applications are hereby incorporated herein by reference.

BACKGROUND

In the manufacture of integrated circuits, devices such as transistors are formed on a wafer and connected together using multiple metallization layers. The metallization layers include vias and interconnects that function as electrical pathways to interconnect the devices. Contacts are used to connect the vias and interconnects to the source, drain, and/or gate of the devices.

In some circumstances, an interfacial layer is formed between the contacts and the source, drain, or gate of the devices. By way of example, a nickel (Ni) metal and a silicidation process may be used to form a nickel silicide (NiSi) interfacial layer.

Unfortunately, the Schottky barrier height of the NiSi interfacial layer is not uniform for both n-type and p-type devices. Indeed, the Schottky barrier height is about 0.43 electron Volts (eV) for a p-type device and about 0.67 eV for an n-type device incorporating the NiSi interfacial layer. This asymmetrical Schottky barrier height for n-type and p-type devices is not particularly suitable when the interfacial layer faces a high mobility material (e.g., germanium (Ge), gallium antimonide (GaSb), indium arsenide (InAs), etc.).

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 10a-10f collectively illustrate a process of forming the CMOS device of FIG. 1.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the present embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a complimentary metal-oxide-semiconductor (CMOS) device. The disclosure may also be applied, however, to other integrated circuits such as, for example, a planar metal-oxide-semiconductor field-effect transistor (MOSFET), double-gate MOSFET, tri-gate MOSFET, FinFET, and the like.

Figure 1:
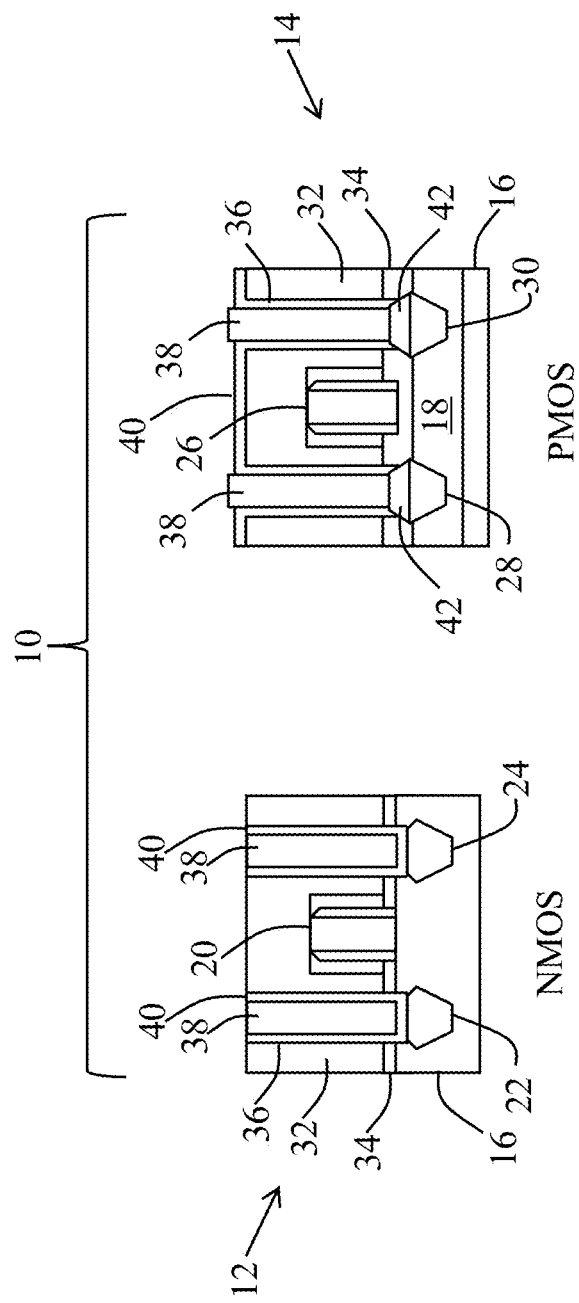
FIG. 1 illustrates an embodiment complimentary metal-oxide-semiconductor (CMOS) device.

Referring now to FIG. 1, an embodiment CMOS device 10 is illustrated. As shown, the CMOS device 10 generally includes an n-type metal-oxide-semiconductor (NMOS) device 12 and a p-type metal-oxide-semiconductor (PMOS) device 14. In an embodiment, the NMOS device 12 and the PMOS device 14 are formed over a p-type substrate 16, a portion of which has been doped to provide an n-well 18 for the PMOS device 14.

Still referring to FIG. 1, the substrate 16 supports a first gate structure 20, a first source 22, and a first drain 24 in the NMOS device 12. The substrate 16 also supports a second gate structure 26, a second source 28, and a second drain 30 in the PMOS device 14. Because the relative position of the source and drain in both the NMOS device 12 and the PMOS device 14 may be interchanged, each source and each drain may be collectively referred to as a source/drain region. In an embodiment, the first source 22, the first drain 24, the second source 28, and the second drain 30 are each epitaxially formed. In an embodiment, the first gate structure 20 and/or the second gate structure 26 may include spacers, a high-k dielectric, a metal, and so on.

In an embodiment, the first source 22 and the first drain 24 of the NMOS device 12 comprise silicon (Si), silicon phosphorus (SiP), silicon carbide phosphorus (SiCP), gallium antimony (GaSb), or silicon germanium (SiGe) having a relatively low germanium concentration. In an embodiment, the second source 28 and the second drain 30 of the PMOS device 14 comprise germanium (Ge), germanium tin (GeSn), or silicon germanium (SiGe) having a relatively high germanium concentration relative to the silicon germanium suitable for use in the first source 22 and the first drain 24.

Still referring to FIG. 1, a dielectric 32 (e.g., an interlevel dielectric) is generally formed over and supported by the substrate 16 on both the NMOS device 12 and the PMOS device 14. In an embodiment, an etch stop layer (ESL) 34 is disposed between the dielectric 32 and the substrate 16. As shown in FIG. 1, the dielectric 32 contains trenches 36 containing a contact metal 38. In an embodiment, the contact metal 38 comprises titanium (Ti), aluminum (Al), titanium nitride (TiN), tungsten (W), or another suitable contact metal.

Still referring to FIG. 1, a titanium-containing layer 40 is disposed on the sidewalls of the trenches 36 in each of the NMOS device 12 and the PMOS device 14. As such, the titanium-containing layer 40 is generally disposed between the dielectric 32 and the contact metal 38 (i.e., contacts). In an embodiment, the titanium-containing layer 40 is also formed between the contact metal 38 and the first source 22 and the contact metal 38 and the first drain 24 in the NMOS device 12. In an embodiment, the titanium-containing layer 40 is formed over a top surface of the PMOS device 14 and/or the NMOS device 12. In an embodiment, the titanium-containing layer 40 comprises a titanium dioxide ($TiO_2$). In an embodiment, the titanium-containing layer 40 has a thickness of between about 1 to about 4 nanometers (nm).

In addition to the above, the second source 28 and the second drain 30 in the PMOS device 14 include a titanium-containing region 42. As shown, the titanium-containing region 42 in the second source 28 and in the second drain 30 generally faces and/or abuts the contact metal 38. In an embodiment, the titanium-containing region 42 is a titanium silicon germanium (Ti(Si)Ge) or a titanium digermanium ($TiGe_2$), depending on the whether the underlying second source 28 and second drain 30 are formed from silicon germanium (Si) or germanium (Ge).

Because the NMOS device 12 includes the titanium-containing layer 40 and the PMOS device 14 includes the titanium-containing region 42 in the second source 28 and the second drain 30, the CMOS device 10 has a low contact resistance while being compatible with CMOS fabrication technology and processes. Indeed, by using a single metal (e.g., titanium) on both the NMOS device 12 and the PMOS device 14, the Schottky barrier height (SBH) is significantly lowered, especially for low dopant activation material.

Figure 2:
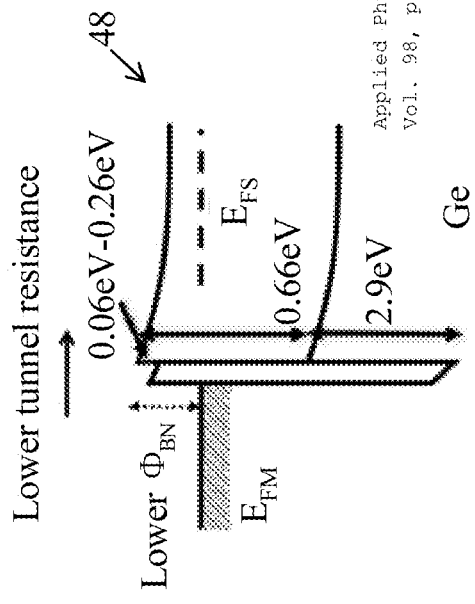
FIG. 2 is a diagram illustrating that titanium dioxide ($TiO_2$) is an effective interfacial layer for Schottky barrier height reduction for materials with an electron affinity of about four (4) electron Volts (eV)

Referring now to FIG. 2, a diagram 44 is provided to illustrate that titanium dioxide ($TiO_2$) is an effective interfacial layer for Schottky barrier height reduction for materials with an electron affinity of about four (4) electron Volts (eV). As shown in the diagram 44, the conduction band 46 of the silicon (Si) is similar to that of the titanium dioxide ($TiO_2$) and the aluminum (Al) contact. Therefore, only a small amount of energy is needed for conduction to occur when the titanium dioxide ($TiO_2$) is disposed between silicon (Si) and an aluminum (Al) contact.

Figure 3:
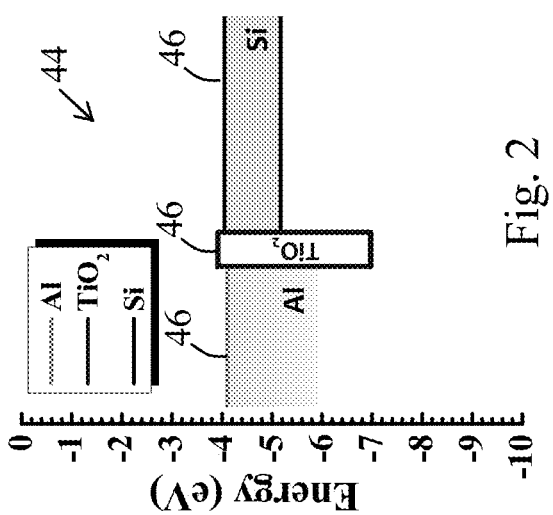
FIG. 3 is a diagram illustrating that the conduction band of germanium (Ge) is similar to that of titanium dioxide ($TiO_2$)
Figure 4:
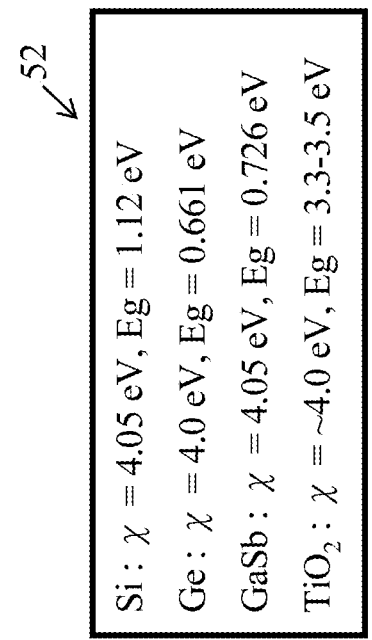
FIG. 4 is a diagram illustrating that the conduction band of gallium antimony (GaSb) is similar to that of the titanium dioxide ($TiO_2$)
Figure 5:
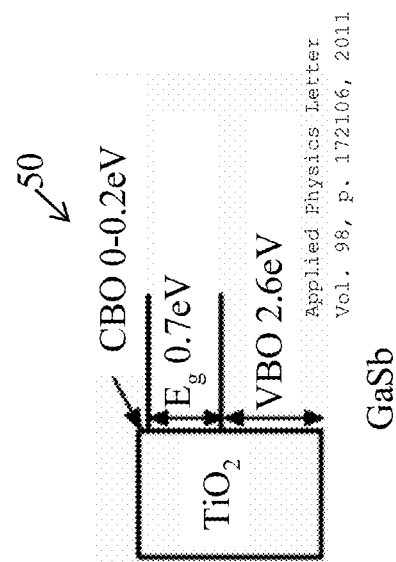
FIG. 5 is a summary of the electron affinity (x) and band gap ($E_g$) of silicon (Si), germanium (Ge), gallium antimony (GaSb), and titanium dioxide ($TiO_2$)
Figures 6, 7:
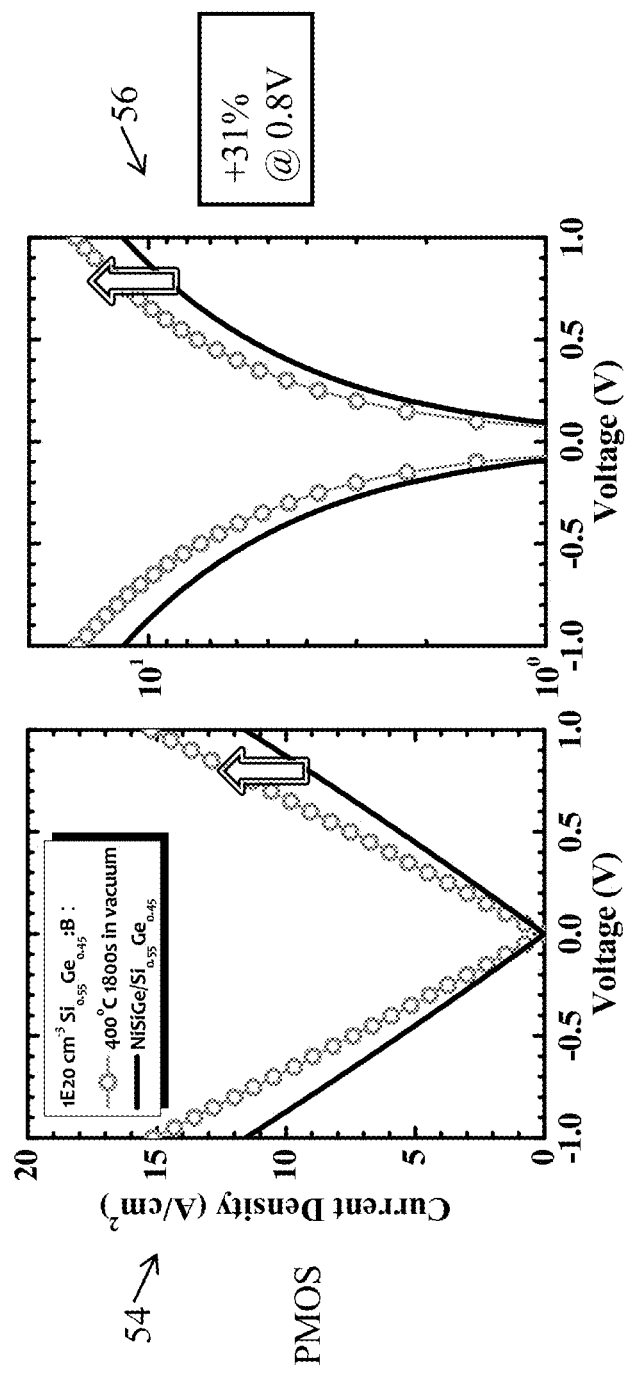
FIGS. 6-9 are graphical representations of experimental data from MOS diodes, which are similar to the NMOS device and the PMOS device of the CMOS device of FIG. 1.
Figures 8, 9:
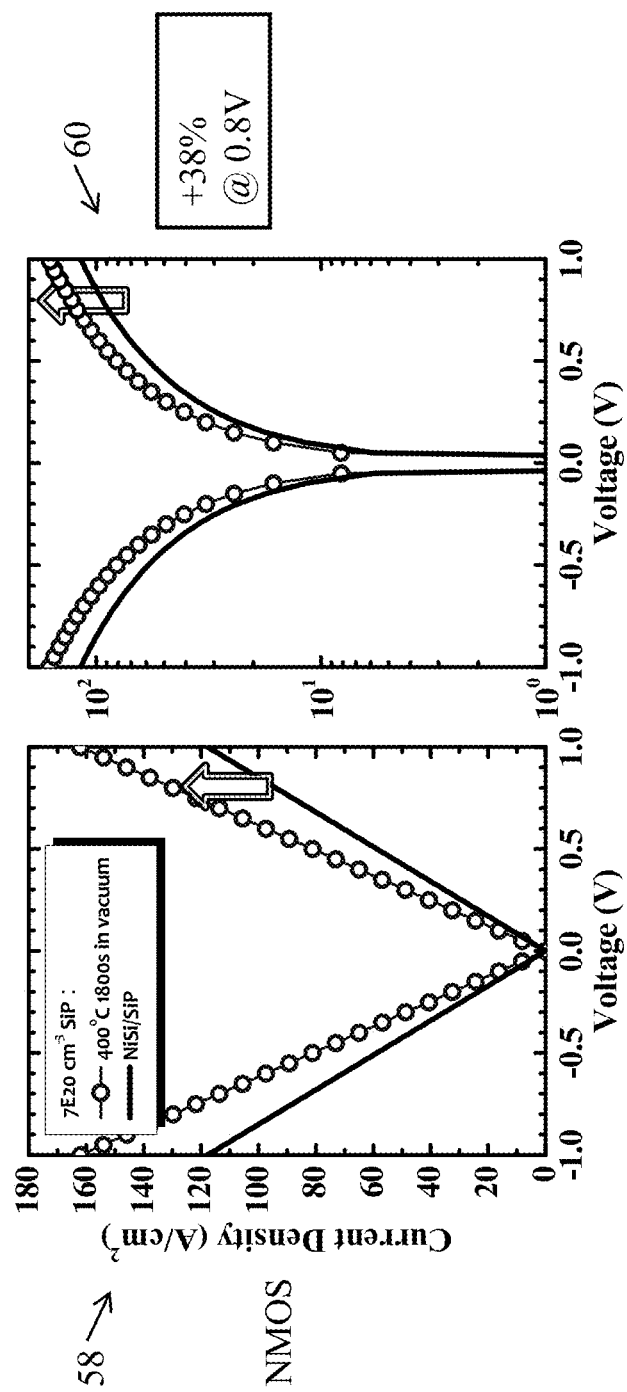

Referring now to FIGS. 3-4, diagrams 48, 50 are provided to illustrate that the conduction band of germanium (Ge) and gallium antimony (GaSb), respectively, are also similar to that of the titanium dioxide ($TiO_2$). Again, only a small amount of energy is needed for conduction to occur through a device using titanium dioxide ($TiO_2$) as an interfacial layer. As shown in FIG. 5, a summary 52 of the electron affinity (x) and band gap ($E_g$) of silicon (Si), germanium (Ge), gallium antimony (GaSb), and titanium dioxide ($TiO_2$) are provided.

Referring now to FIGS. 6-9, graphical representations 54, 56, 58, 60 of experimental data from MOS diodes, which are similar to the NMOS device 12 and the PMOS device 14, are presented. The experiment involved the deposition of about 2 nm (ex-situ) of titanium (Ti) through physical vapor deposition (PVD), the post-dielectric annealing (PDA), and contact metal of titanium nitride (TiN) or titanium (Ti). As shown, using titanium dioxide ($TiO_2$) as an interfacial layer in the NMOS device 12 and the PMOS device 14 achieves better current density per volt. Indeed, the current density per volt increased by 31% and 38% when titanium dioxide ($TiO_2$) was utilized.

Figure 10E:
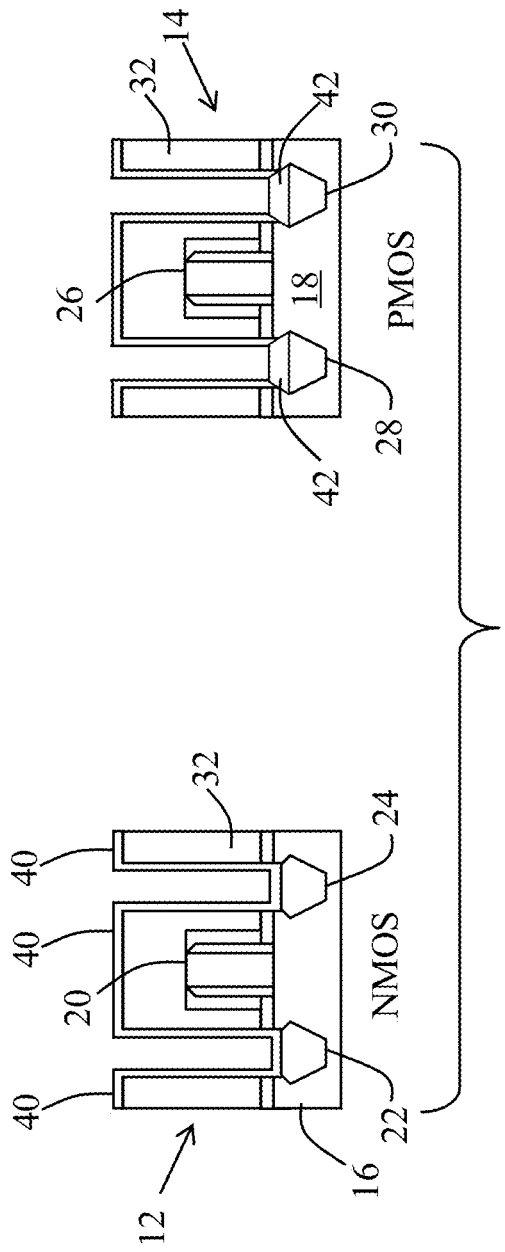

Referring collectively to FIGS. 10a-10f, a process of forming the CMOS device 10 of FIG. 1 is illustrated. For ease of illustration, the NMOS device 12 and the PMOS device 14 are shown separately. As shown in FIG. 10a, the first gate structure 20, the first source 22, and the first drain 24 are formed over the substrate 16 in the NMOS device 12 and the second gate structure 26, the second source 28, and the second drain 30 are formed over the n-well 18 in the PMOS device 14.

Still referring to FIG. 10a, the etch stop layer 34 and the dielectric 32 are formed over or around the first gate structure 20, the first source 22, and the first drain 24 in the NMOS device 12 and the second gate structure 26, the second source 28, and the second drain 30 in the PMOS device 14. Next, as shown in FIG. 10b, trenches 36 are etched into the dielectric 32 over the first source 22 and the first drain 24 in the NMOS device 12 and the second source 28 and the second drain 30 in the PMOS device 14.

Referring now to FIG. 10c, a single metallic layer, such as a layer of titanium (Ti) 62, is deposited over the NMOS device 12 and the PMOS device 14. In an embodiment, the layer of titanium 62 is deposited through physical vapor deposition (PVD). As shown, the layer of titanium 62 generally coats the top surface of the dielectric 32 and the sidewalls of the trenches 36. The layer of titanium 62 also covers the first source 22 and the first drain 24 in the NMOS device 12 and the second source 28 and the second drain 30 in the PMOS device 14.

Referring now to FIG. 10d, an annealing process is performed (which is represented by the arrows). In an embodiment, the annealing process is performed at a temperature of about 300 degrees Celsius to about 500 degrees Celsius, at a vacuum ambient pressure of less than about $1 \times 10^{-7}$ Torr, and/or for a duration of about thirty minutes. In an embodiment, the annealing process may be performed under different conditions or using different parameters.

Referring now to FIG. 10e, the annealing process simultaneously forms the titanium-containing layer 40 and the titanium-containing region 42. As shown, the titanium-containing layer 40 resides on the top surface of the dielectric 32 and on the sidewalls of the trenches 36 in both the NMOS device 12 and the PMOS device 14. The titanium-containing layer 40 is also formed over the first source 22 and the first drain 24 of the NMOS device 12. As shown, the titanium-containing region 42 is formed in the second source 28 and the second drain 30 of the PMOS device 14. Notably, the titanium-containing layer 40 and the titanium-containing region 42 reduce the source/drain contact resistance in the NMOS device 12 and the PMOS device 14, respectively.

Figure 10F:
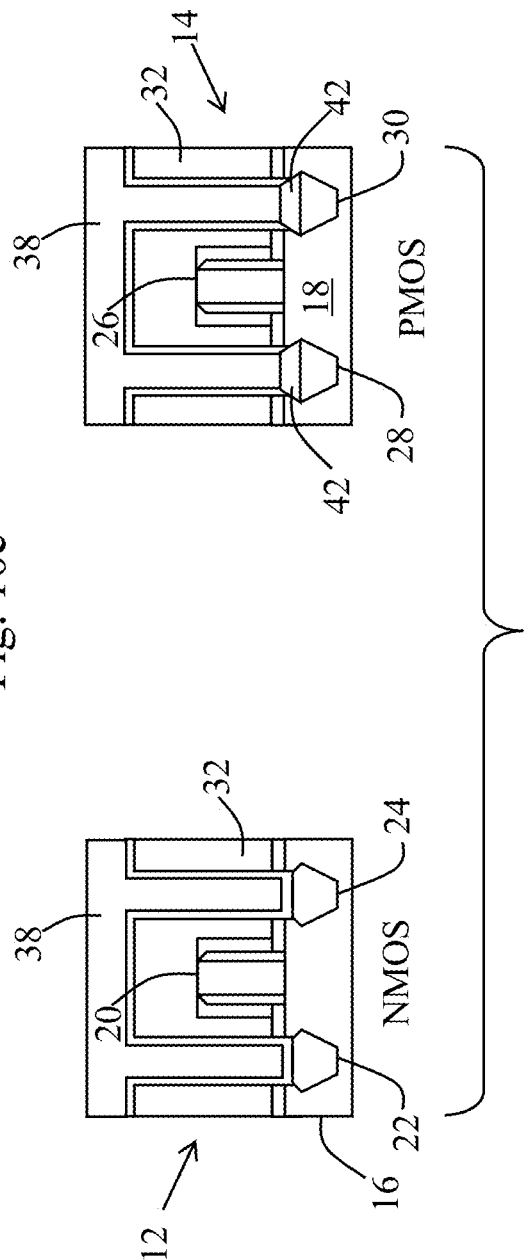

Referring now to FIG. 10f, the contact metal 38 is deposited over the titanium-containing layer 40 and the titanium-containing region 42 and within the trenches 36 of the NMOS device 12 and the PMOS device 14. Thereafter, the upper portions of the contact metal 38 are removed through, for example, a chemical-mechanical planarization (CMP) process to form the NMOS device 12 and the PMOS device 14 from the CMOS device 10 as shown in FIG. 1.

From the foregoing, it should be recognized that the embodiment CMOS device 10 of FIG. 1 has numerous advantages and benefits. For example, the CMOS device 10 offers low contact resistance and is easily integrated with CMOS technology. In addition, the CMOS device 10 uses a single metal (e.g., titanium) for both the n-type and p-type contacts to effectively lower Schottky barrier height, especially for low dopant activation material. The CMOS device 10 also benefits from automatic band-alignment for both the conduction and valence band to lower the contact resistivity.

An embodiment complimentary metal-oxide-semiconductor (CMOS) device includes an n-type metal-oxide-semiconductor (NMOS) device having a titanium-containing layer interposed between a first metal contact and an NMOS source and a second metal contact and an NMOS drain, and a p-type metal-oxide-semiconductor (PMOS) device having a PMOS source and a PMOS drain, the PMOS source having a first titanium-containing region facing a third metal contact, the PMOS drain including a second titanium-containing region facing a fourth metal contact.

An embodiment integrated circuit including a substrate supporting a first gate structure, a first source/drain region, a second gate structure, and a second source/drain region, the second source/drain region including a titanium-containing region, a first metal contact formed over the first source/drain region and a second metal contact formed over the second source/drain region, a dielectric disposed between the first gate structure and the first metal contact and between the second gate structure and the second metal contact, and a titanium-containing layer interposed between the first metal contact and the first source/drain region.

An embodiment method of forming an integrated circuit including forming a first source/drain region in an n-type substrate and a second source/drain region in a p-type substrate, forming a dielectric over the n-type substrate and the p-type substrate, etching trenches in the dielectric over the first source/drain region and the second source/drain region, depositing titanium in the trenches, and performing an annealing process to form titanium dioxide ($TiO_2$) over the first source/drain region and to generate a titanium-containing region in the second source/drain region.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An integrated circuit device comprising:
    an n-type metal-oxide-semiconductor (NMOS) device comprising:
        a first source/drain region;
        a first metal contact over the first source/drain region;
        a first titanium-containing layer having a portion between the first metal contact and the first source/drain region, wherein the first titanium-containing layer comprises a dielectric material; and
    a p-type metal-oxide-semiconductor (PMOS) device comprising:
        a second source/drain region;
        a second metal contact over the second source/drain region; and
        a second titanium-containing layer between the second metal contact and the second source/drain region, and wherein the second titanium-containing layer comprises a non-dielectric material.

2. The integrated circuit device of claim 1 further comprising a dielectric layer, with the first metal contact being in the dielectric layer, wherein the first titanium-containing layer further comprises a sidewall portion extending to a top surface of the dielectric layer.

3. The integrated circuit device of claim 1, wherein the second titanium-containing layer comprises a compound of titanium and an element in the second source/drain region.

4. The integrated circuit device of claim 3, wherein the first titanium-containing layer is substantially free from major elements in the first source/drain region.

5. The integrated circuit device of claim 1, wherein the second titanium-containing layer comprises titanium silicon germanium (Ti(Si)Ge) or titanium digermanium ($TiGe_2$).

6. The integrated circuit device of claim 5, wherein the first titanium-containing layer comprises titanium dioxide ($TiO_2$).

7. The integrated circuit device of claim 1 further comprising a dielectric layer, and the first titanium-containing layer extends between the dielectric layer and the first metal contact.

8. The integrated circuit device of claim 1, wherein the second source/drain region has a higher germanium concentration than the first source/drain region.

9. An integrated circuit device comprising:
    a semiconductor substrate;
    a gate stack over the semiconductor substrate;
    a source/drain region on a side of the gate stack;
    a metal contact overlapping the source/drain region;
    a titanium-containing dielectric layer on a sidewall of the metal contact;
    a dielectric layer over the source/drain region, with the metal contact, the titanium-containing dielectric layer, and the gate stack being in the dielectric layer, and wherein the titanium-containing dielectric layer extends from a top surface to a bottom surface of the dielectric layer; and
    a conductive region directly underlying the metal contact and directly over the source/drain region.

10. The integrated circuit device of claim 9, wherein a bottom end of the titanium-containing dielectric layer contacts the conductive region.

11. The integrated circuit device of claim 9, wherein the conductive region comprises a material selected from titanium silicon germanium (Ti(Si)Ge) and titanium digermanium ($TiGe_2$).

12. The integrated circuit device of claim 9, wherein the titanium-containing dielectric layer comprises titanium oxide.

13. The integrated circuit device of claim 9, wherein the gate stack and the source/drain region are parts of a p-type transistor.

14. The integrated circuit device of claim 9 further comprising:
    an additional source/drain region comprising silicon germanium;
    an additional dielectric layer over the additional source/drain region;
    an additional contact plug over the additional source/drain region and in the additional dielectric layer; and
    a titanium-containing conductive layer between the additional contact plug and the additional source/drain region, wherein the titanium-containing conductive layer comprises titanium silicon germanium (TiSiGe) or titanium germanium.

15. The integrated circuit device of claim 9, wherein the titanium-containing dielectric layer contacts the metal contact to form an interface, and the interface extends from an additional top surface of the metal contact to an additional bottom surface of the metal contact.

16. An integrated circuit device comprising:
    an n-type metal-oxide-semiconductor (NMOS) device comprising:
        a first source/drain region comprising silicon;
        a first dielectric layer over the first source/drain region; and
        a first contact plug over the first source/drain region and in the first dielectric layer; and a p-type metal-oxide-semiconductor (PMOS) device comprising:
  a second source/drain region comprising silicon germanium;
  a second dielectric layer over the second source/drain region;
  a second contact plug over the second source/drain region and in the second dielectric layer; and
  a titanium-containing layer between the second contact plug and the second source/drain region, wherein the titanium-containing layer comprises titanium silicon germanium (TiSiGe) or titanium germanium.

17. The integrated circuit device of claim 16, wherein the NMOS device further comprises an insulating layer, with the insulating layer comprising a bottom portion between the first source/drain region and the first contact plug, wherein the insulating layer further comprises an additional sidewall portion separating the first contact plug from the first dielectric layer.

18. The integrated circuit device of claim 17, wherein the insulating layer comprises titanium oxide.

19. The integrated circuit device of claim 17, wherein the NMOS device is free from silicide between the insulating layer and the first source/drain region.

20. The integrated circuit device of claim 16, wherein the titanium-containing layer comprises TiSiGe.

* * * * *